United States Patent [19]

Silverman

[11] 4,244,109

[45] Jan. 13, 1981

[54] APPARATUS FOR MOUNTING AND ALIGNING PRINTED CIRCUIT BOARD

[75] Inventor: Ira Silverman, Winnipeg, Canada

[73] Assignee: Pertec Computer Corporation, El Segundo, Calif.

[21] Appl. No.: 733,868

[22] Filed: Oct. 19, 1976

[51] Int. Cl.³ .............................................. G01B 3/00
[52] U.S. Cl. ........................... 33/180 R; 101/DIG. 12
[58] Field of Search ............... 33/180 R, 184.5, 81 R; 101/DIG. 12; 355/74; 250/237

[56] References Cited

U.S. PATENT DOCUMENTS

| | | | |
|---|---|---|---|
| 3,381,554 | 5/1968 | Ploch et al. | 33/184.5 |
| 3,957,371 | 5/1976 | Rich | 101/DIG. 12 |

*Primary Examiner*—Willis Little

*Attorney, Agent, or Firm*—Freilich, Hornbaker, Wasserman, Rosen & Fernandez

[57] ABSTRACT

Apparatus for aligning a printed circuit board (PCB) relative to a datum line defined between two pins fixed to a supporting member. One pin is cylindrically shaped and the other is shaped in the form of a frustum of a cone. Two aligning holes are provided on the PCB spaced apart by a distance slightly different from the spacing between the pins so that with one hole over the cylindrical pin, the edge of the other hole rests on the sloped side of the other pin. As the PCB is pressed against the supporting member between the two pins by securing means, the PCB is sprung, and the stored force of the sprung PCB presses the edges of the PCB holes against the pins for precise alignment relative to the datum line between the two pins.

5 Claims, 3 Drawing Figures

APPARATUS FOR MOUNTING AND ALIGNING PRINTED CIRCUIT BOARD

BACKGROUND OF THE INVENTION

This invention relates generally to means for aligning and mounting a removable member on a supporting member and more particularly to means suitable for aligning and mounting a printed circuit board (PCB).

In some applications it is important that a removable printed circuit board be mounted in precise alignment with a datum line on a supporting structure. For example, in replacing a printed circuit board having an optical element, the board must be aligned with the precision required for the optical element to operate in the system.

An important application for the present invention is in alignment of an amplifier printed circuit board bearing photodiodes for an opto-electronic transducer used in determining position and/or velocity of one member with respect to another member, such as where a reticle is affixed to a stationary frame and a transmission grating is affixed to a carriage for a read/write head in a magnetic disk data storage system. Typically, the disk recording medium is rotated at a constant speed and the head is flown over the surface of the disk on a gas film bearing and positioned to the appropriate track by the use of a linear voice-coil type of motor. The motor attached to the head carriage is controlled in respect to both velocity and position. As the carriage moves the head to the correct track address, it is brought to a controlled stop and positioned over the track by a stable servo loop.

An opto-electronic transducer will permit proper positioning of a magnetic read/write head on a disk usually having as many as 200 tracks per inch due to the extreme accuracy with which a scale and reticle can be produced using photographic techniques, provided the electronic circuits employed to detect motion of the scale relative to the reticle are adapted to operate with a proper degree of accuracy. This requires the elements-scale, reticle and photodiodes-to be properly aligned.

Alignment of the reticle with the photodiodes can easily be made with the necessary precision during factory assembly of an amplifier circuit board bearing the photodiodes and a frame bearing the reticle. The problem lies in effectively replacing the printed circuit board in the field with a minimum of effort and tools, but with the same precision as in the factory.

A typical opto-electronic transducer which may use the present invention to advantage is disclosed in a copending application Ser. No. 699,248 filed June 24, 1976. Others are disclosed in U.S. Pat. Nos. 3,783,277 and 3,809,895. However, the present invention is not to be construed as being limited to printed circuit boards carrying opto-electronic transducers since it may be used to equal advantage in any assembly which requires alignment of a removable member such as a printed circuit board.

SUMMARY OF THE INVENTION

In accordance with a preferred embodiment of the invention, a supporting member is provided having a cylindrical pin and a tapered pin, preferably in the form of a frustum of a cone, which pins are spaced apart along a datum line or center line to which the PCB is to be aligned. The PCB is provided with holes spaced apart to receive the supporting member pins therethrough. The cylindrical pin is of a diameter less than the diameter of the correspondingly placed hole in the printed circuit board and the free end of the tapered pin has a diameter smaller than the diameter of the other hole in the board. The distance between the centers of the pins approximately equals the distance between the centers of the holes to permit the printed circuit board to be placed with the one hole over the cylindrical pin and the other hole with its edge resting on the side of the tapered pin. The board is then secured to the supporting member at one or more points between the two pins with suitable means, such as machine screws through oversize holes in the board, thus allowing the one hole to seat over the cylindrical pin and the edge of the other hole to press against the side of the tapered pin as the board bends between the securing point and the tapered pin. This assures correct alignment of the center line defined by the two holes in the printed circuit board with the datum line between the two pins on the supporting member.

The novel features that are considered characteristic of this invention are set forth with particularly in the appended claims. The invention will best be understood from the following description when read in connection with the accompanying drawings.

DESCRIPTION OF PREFERRED EMBODIMENTS

Figure 1:
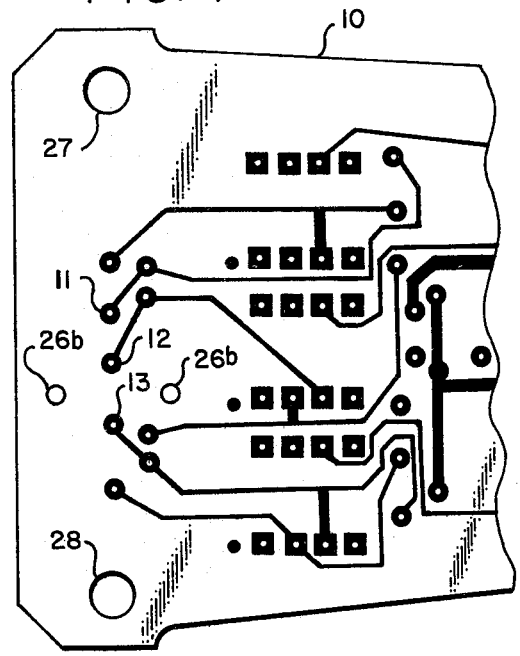
FIG. 1 is a plan view of a printed circuit board to be aligned on a supporting member.

Referring now to FIG. 1 of the drawing, an amplifier printed circuit board (PCB) 10 (partially broken away) bears three photodiodes 11, 12 and 13 which are to be aligned with elements of a reticle formed with an emulsion on a glass plate 14 (FIGS. 2 and 3) using photographic techniques. These elements are a first transmission grating 15, a second transmission grating 16 offset laterally from the first by only ¼ of the spacing between vertical transmission lines (as viewed in the drawing), and a slit 17. These elements are used as more fully described in the aforesaid application.

Figure 3:
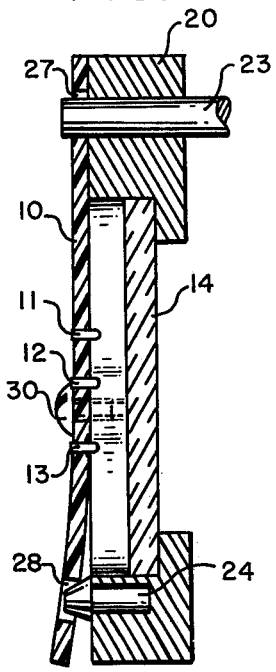
FIG. 3 is a sectional view of the supporting member with the printed circuit board in place.
Figure 2:
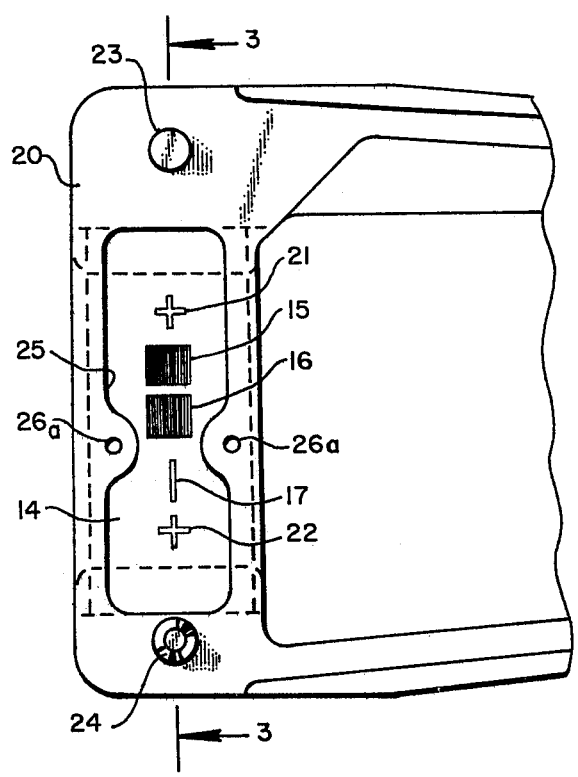
FIG. 2 is a plan view of the supporting member for the printed circuit board of FIG. 1.

The glass plate is preferably bonded into the rear of a frame 20 as shown in FIG. 3 and aligned relative to the frame using two aligning bench marks 21 and 22 shown on the plate in FIG. 2 such that the bench marks are precisely aligned on a center line between the axis of a cylindrical pin 23 and the axis of a tapered pin 24 formed in the shape of a frustum of a right circular cone. Both pins may be formed as a unitary part of the frame, or formed separately and then press fitted as shown in FIG. 3. Once aligned, the glass plate 14 bearing the reticle elements 15, 16 and 17 is secured in place as a consequence of being bonded such as with epoxy or other adhesive material. In either case, the glass plate is held by the frame in a fixed position relative to the pins 23 and 24.

The frame 20 has an hour-glass shaped opening 25 through which the reticle elements may be viewed, as shown in FIG. 2. Threaded holes 26a are provided in the frame to secure the PCB shown in FIG. 1 to the face of the frame with the photodiodes 11, 12 and 13 aligned on the center line between the pins 23 and 24. To assure that alignment, holes 27 and 28 are formed through the PCB with their centers on the center line through centers of the aligned photodiodes.

The distance between the centers of holes 27 and 28 is slightly different from the distance between the centers of pins 23 and 24 and is chosen in conjunction with the hole size diameter and pin taper so as to yield a sufficient centering force around the tapered pin without overstressing the board. The size and distance of the hole 27 from the photodiodes and the elements 15, 16 and 17 of the reticle are spaced from the pin 23 so that, when the low part of the hole 27 (as viewed in FIG. 1) is pressed against the pin 23, the photodiodes on the PCB are properly aligned and spaced over the reticle elements.

In use, when machine screws 30 (FIG. 3) are inserted through holes 26b in the PCB (FIG. 1) and tightened to press the PCB against the frame 20, the sloped side of the bent PCB functions as a spring, and the sloped side of tapered pin 24 functions as a cam engaging the edge of hole 28 and forcing the PCB and edge of hole 27 against the pin 23. Since the pins 23 and 24 are in line with the reticle elements, very close alignment of the photodiodes with respect thereto is achieved. In other words, since the reticle element is secured to the frame in alignment with the two pins, and the photodiodes are mounted on the PCB in alignment with the two holes, alignment of the holes with the pins assures alignment of the photodiodes with the reticle elements. Hole and pin irregularities are taken into consideration and do not add significantly to the tolerance of the photodiode alignment on the PCB and reticle alignment to the frame. Friction between the hole edges and pins is also a factor in the total alignment tolerance and is taken into consideration. As the screws 30 are screwed in, the PCB is sprung, thus storing a force that will overcome most friction in pressing holes 27 and 28 against the pins 23 and 24, thus causing the "high spots" on the pins to seek the "low spots" on the holes.

Although a particular embodiment of the invention has been described and illustrated herein, it is recognized that modifications and variations may readily occur to those skilled in the art. It is therefore intended that the claims be interpreted to cover such modifications and variations.

What is claimed is:

1. Apparatus for mounting and aligning a removable member on a supporting surface comprising
    a first substantially cylindrical pin extending from said supporting surface,
    a second pin spaced from said first pin extending from said supporting surface, said second pin having a fixed cam surface inclined relative to the axis of said first pin,
    said removable member having first and second aligning holes formed therein each defined by a surrounding edge, said holes being spaced by a distance approximately equal to the spacing between said pins whereby said first hole can receive said first pin therethrough and the edge of said second hole can simultaneously engage said second pin cam surface, and
    means for pressing said removable member against said supporting surface between said pins to force said second hole edge along said cam surface and to thus engage said first hole edge against said first pin.

2. Apparatus as defined in claim 1 wherein said other pin is in the shape of a frustum of a right circular cone.

3. Apparatus as defined in claim 1 wherein said pressing means is comprised of at least one screw through an oversize hole offset from the center line between said two aligning holes.

4. Apparatus as defined in claim 1 wherein said removable member comprises a flat board, and wherein said pressing means exerts a sufficient force on said board to flex it between said point at which said pressing force is applied and said point of engagement of said second hole edge and said cam surface.

5. Apparatus as defined in claim 1 wherein said supporting surface includes an opening between said pins, a plate having at least one optical element, and means for securing said plate with said optical element aligned with respect to a line between the centers of said pins, and wherein said removable member comprises a printed circuit board having mounted thereon at least one optical element to be aligned with the optical element of said plate for optical cooperation therewith, said optical element on said board being aligned with respect to a line passing through the centers of said first and second holes.

* * * * *